United States Patent [19]

Dunn

[11] Patent Number: 5,001,398
[45] Date of Patent: Mar. 19, 1991

[54] LAMP INTENSITY CONTROL SYSTEM HAVING OVER-CURRENT PROTECTION

[75] Inventor: William C. Dunn, Mesa, Ariz.

[73] Assignee: Motorola, Inc., Schaumburg, Ill.

[21] Appl. No.: 374,720

[22] Filed: Jul. 3, 1989

[51] Int. Cl.$^5$ .............................................. H60Q 1/26
[52] U.S. Cl. ....................................... 315/77; 315/80; 315/291; 315/293; 315/309; 330/298; 340/468; 340/469; 307/10.8
[58] Field of Search .................... 315/77, 82, 119, 121, 315/291, 294, 292, 293, 312, 309; 340/475, 468, 469; 330/289, 298

[56] References Cited

U.S. PATENT DOCUMENTS

| | | | |
|---|---|---|---|
| 1,981,985 | 11/1934 | Braselton | 307/10.8 |
| 3,244,934 | 5/1966 | Webb | 340/469 |
| 3,277,442 | 10/1966 | Kearny | 340/469 |
| 3,284,770 | 11/1966 | Bleiweiss et al. | 340/475 |
| 3,603,840 | 9/1971 | Durocher | 315/82 |
| 4,149,124 | 4/1979 | Glogolja | 330/290 |
| 4,904,906 | 2/1990 | Atherton et al. | 315/291 |

Primary Examiner—Eugene R. Laroche
Assistant Examiner—Son Dinh
Attorney, Agent, or Firm—Michael D. Bingham; Robert D. Atkins

[57] ABSTRACT

A lamp intensity control system combines the functions of the tail light, the brake light, and the turn indicator light signals into one signal for controlling a plurality of lamps in an automobile. The tail light, brake light and turn indicator light signals are combined into one signal and modulated wherein the percent of modulation determines the intensity of the brightness of the plurality of lamps. Temperature protection is provided wherein a temperature limit circuit monitors the temperature of a SENSFET and disables the SENSFET if its temperature exceeds a predetermined magnitude. Over-current and open lamp conditions are monitored by comparator circuits. An over-current condition causes the SENSFET to be disabled. An over-temperature, over-current or open-lamp condition is signaled by a fault output signal.

13 Claims, 2 Drawing Sheets

| TAIL LIGHT | BRAKE LIGHT | TURN INDICATOR | LAMP INTENSITY - (DRIVER SIGNAL) |
|---|---|---|---|
| 0 | 0 | 0 | 0% — STEADY |
| 0 | 0 | 1 | 0-50% — STEADY |
| 0 | 1 | 0 | 50% — MODULATED |
| 0 | 1 | 1 | 0-50% — STEADY |
| 1 | 0 | 0 | 50% — MODULATED |
| 1 | 0 | 1 | 50-100% — STEADY |
| 1 | 1 | 0 | 100% — MODULATED |
| 1 | 1 | 1 | 50-100% — STEADY |

TRUTH TABLE

*FIG. 2*

LAMP INTENSITY CONTROL SYSTEM HAVING OVER-CURRENT PROTECTION

FIELD OF THE INVENTION

This invention relates in general to the field of lamp control circuits and, more particularly, to a system in an automobile for combining several signals into one modulated signal for controlling the light intensity in a plurality of indicator lamps and for providing over-current and over-temperature protection.

BACKGROUND OF THE INVENTION

The intensity of light that is provided in automobile tail lights, brake lights and turn indicator lights has generally been provided by supplying a D.C. current to the respective lamp, or more recently, to one of the respective filaments of the lamp. While this system has been used successfully in the past, there are several disadvantages including the need to run a separate wire to each lamp or filament therein increasing costs and decreasing reliability. Furthermore it is desirable to have a warning system to alert the operator of a lamp or wiring failure.

A solution to these problems is to combine the three signals into one signal that varies the intensity of light in the lamps by varying the duty cycle of the current driving the lamps. In this way, only one wire is required and a plurality of parallel lamps may be used to provide additional safety and reliability. The expected current and temperature could further be monitored to shut down the system and/or send a warning signal therein alerting the operator of a problem.

Thus, what is needed is a system in an automobile for combining several signals into one modulated signal for controlling the light intensity in a plurality of indicator lamps and for providing over-current and over-temperature protection.

SUMMARY OF THE INVENTION

Accordingly, it is an object of the present invention to provide an improved lamp intensity control system.

Another object of the present invention is to provide a lamp intensity system which combines a plurality of indicator signals into one modulated signal.

Yet another object of the present invention is to provide a lamp intensity control system having improved reliability wherein over-current and over-temperature protection is present.

Still another object of the present invention is to provide a lamp intensity control system having a fault warning signal.

In carrying out the above and other objects of the invention in one form, there is provided a lamp intensity control system for driving at least one lamp, comprising a plurality of input terminals coupled for receiving a plurality of control signals, and a control signal encoder means coupled to the plurality of input terminals for receiving the plurality of control signals for providing a driver signal. A driver means is coupled for receiving the driver signal and coupled to at least one lamp for providing a current responsive to the driver signal for controlling the intensity of the at least one lamp. Temperature monitoring is provided by a temperature sensing means located adjacent to and coupled to the driver means for detecting an over-temperature condition and providing an over-temperature signal as well as shutting down the driver means if the detected temperature exceeds a predetermined magnitude. A modulation means is coupled to the control signal encoder means for controlling the duty cycle of the driver signal wherein the light intensity of the lamp is responsive to the amount of modulation.

The above and other objects, features, and advantages of the present invention will be better understood from the following detailed description taken in conjunction with the accompanying drawings.

BRIEF DESCRIPTION OF THE DRAWINGS

FIG. 2 is a truth table of the control signal encoder circuit illustrated in FIG. 1.

DETAILED DESCRIPTION OF THE INVENTION

Figure 1:
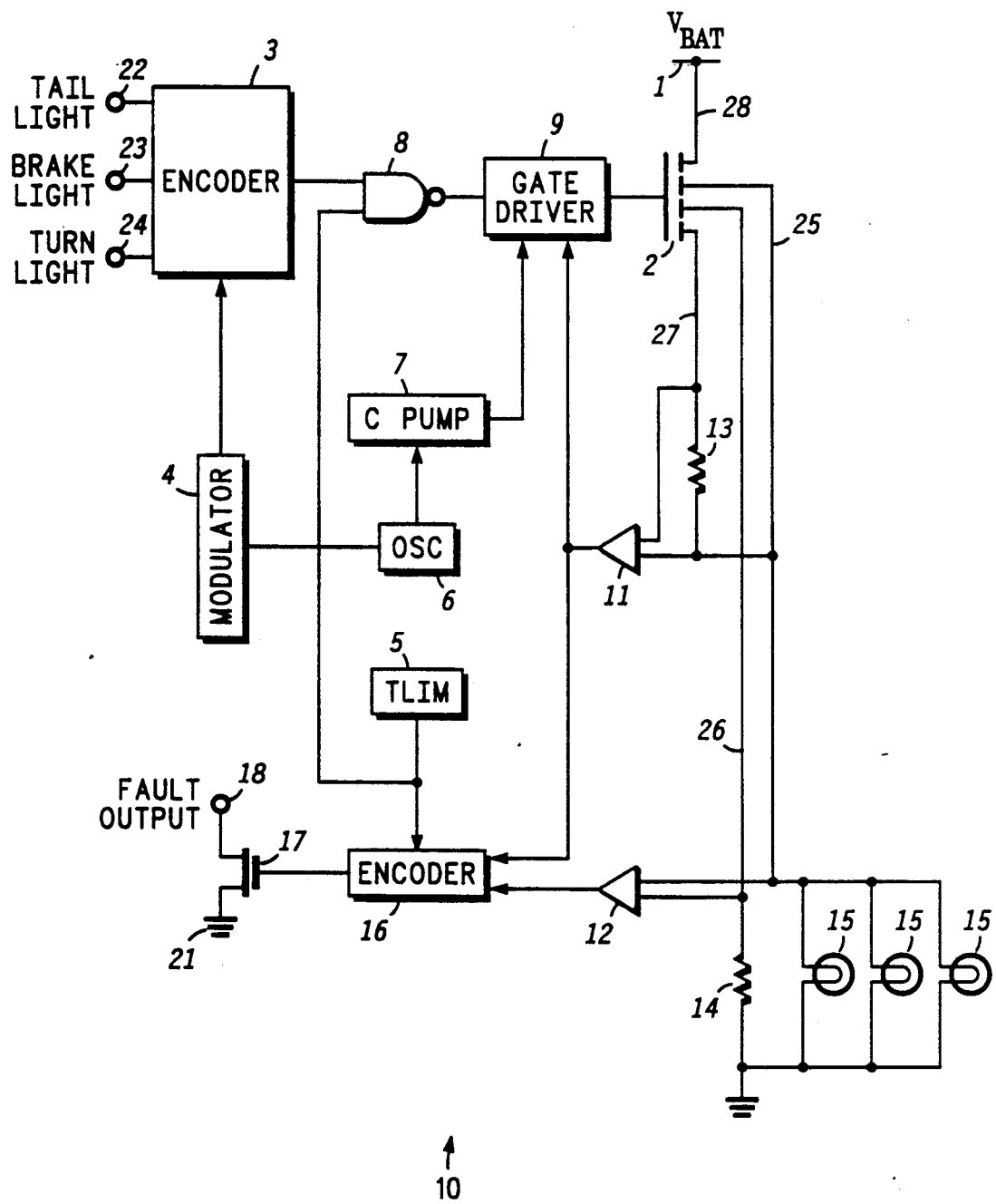
FIG. 1 is a schematic diagram of the present invention.

Referring to FIG. 1, a lamp intensity control system 10 is illustrated which combines a tail light signal, a brake light signal, and a turn indicator light signal into a single modulated signal wherein the duty cycle and average D.C. level of the modulated signal is determined based upon the state of the three input signals. The three input signals, tail light, brake light, and turn indicator, are applied to the three input terminals 22, 23, and 24, respectively. A control signal encoder 3 is connected to the terminals 22, 23, and 24, and is responsive to the three input signals. Although the three input signals are shown applied to the three terminals 22, 23, and 24, it should be appreciated that the three signals could be encoded into a single signal before being applied to the lamp intensity control system 10. A modulator circuit 4 is connected to the control signal encoder circuit 3 for modulating an output or driver signal of the control signal encoder circuit 3. The modulator circuit may provide, for example, pulse width modulation, therein varying the duty cycle of the driver signal.

FIG. 2 shows a truth table of all the various combinations of the three input signals and the resulting driver signal (which determines lamp intensity) as a result of the decoding and modulating functions performed by the control signal encoder 3 and the modulator 4. As an example, when both the tail lights and a turn indicator is on (represented by a "1"entry), and the brake light is off (represented by a"0" entry), the driver signal is 50% to 100% modulated. If pulse width modulation is used, the driver signal has a duty cycle which varies cyclically from 50% to 100% causing the brightness of a plurality of lamps 15 to vary from half brightness (tail light) to full brightness (tail light and turn indicator on).

An oscillator 6 is connected to the modulator 4 for setting the time period of modulation of the modulator 4. The output of the control signal encoder 3 is connected to an input of a Nand gate 8 whose output is connected to an input of a gate driver 9. A charge pump 7 has an output connected for supplying a charge pump voltage to the gate driver 9. A charge pump is a circuit which uses voltage multiplication techniques to make available the charge pump voltage having a peak magnitude which is greater than the magnitude of the positive supply voltage(available at a supply voltage terminal 1). The oscillator 6 has a second output connected to an input of the charge pump 7 wherein the frequency of the second output of the oscillator 6 determines the time required to charge the charge pump voltage to its maximum magnitude. The frequency of the second output is not necessarily equal to the frequency of the first output of the oscillator 6.

The output of the gate driver 9, a gate driver voltage, may have a peak magnitude which is substantially equal to the peak magnitude of the charge pump voltage even though the peak magnitude of it input voltage (output on Nand gate 8) is substantially equal to the positive supply voltage. The output of the gate driver 9 is connected to the control electrode (gate) of a Sense Field Effect Transistor (SENSFET) 2. A SENSFET is a MOS power Field Effect Transistor having a plurality of drains wherein only a small portion of current flowing through the SENSFET is available through selected ones of the drains. The small portions of a lamp current may be used as samples to determine the magnitude of the lamp current flowing through the SENSFET 2. The SENSFET 2 has a current carrying electrode 28 (source) connected to the supply voltage terminal 1 for receiving the positive supply voltage, and a current carrying electrode 25 (drain) coupled to a supply voltage terminal 21 by the plurality of lamps 15 and supplies the lamp current to the plurality of lamps 15. A current carrying electrode 26 (drain) is coupled to the supply voltage terminal 21 via a resistor 14 and a current carrying electrode 27 (drain) is coupled to the plurality of lamps 15 by a resistor 13.

When the gate driver voltage is high, the SENSFET 2 is on and supplies the lamp current to the plurality of lamps 15. Since the SENSFET 2 is of an N-type material, it is necessary to over-drive the gate (apply a voltage having a magnitude greater than the magnitude of the voltage developed at the drains) in order to minimize the rdson (resistance from source to drain while in the conducting state). The plurality of lamps 15 are single filament lamps and the parallel connection of the lamps 15 provide continuous operation in the event one or more of the lamps 15 fail.

Because the lamp current supplied by the SENSFET 2 is significant, it is possible for the lamp intensity control circuit 10 to get hot. If the current carrying electrode 25 were to become shorted to the supply voltage terminal 21 (by a loose wire, faulty lamp, etc), an excessive amount of lamp current would flow and the lamp intensity control circuit 10 could be destroyed by excessive heat. To prevent this destruction, a Temperature Limit (TLIM) circuit 5 is laid out next to, or in close proximity to the SENSFET 2 and has an output connected to an input of the Nand gate 8 and to the input of a fault signal encoder 16. If the temperature of the SENSFET 2 increases beyond a predetermined maximum value, the output of the TLIM circuit 5 will go low therein disabling the gate driver 9 and turning the SENSFET 2 off.

A second means of protection is provided in the lamp intensity control system 10 by a Current Limiting (ILIM) comparator 11. A first input of the ILIM comparator 11 is connected to the current carrying electrode 27 (drain) of the SENSFET 2, and a second input is connected to the current carrying electrode 25. The resistor 13 is coupled between the first and second inputs of the ILIM comparator 11 for developing a differential voltage between the two inputs proportional to the currents flowing in the current carrying electrodes 25 and 27. The output of the ILIM comparator 11 is connected to the fault signal encoder 16 to signal when the lamp current exceeds a predetermined maximum value indicating an over-current condition. The output of the ILIM comparator 11 is also connected to the gate driver 9, wherein the gate driver 9 will be disabled if a over-current condition occurs.

A burned out lamp of the plurality of lamps 15 is detected by an Open Circuit Sense (OCSENSE) comparator 12 whose inputs are connected to the current carrying electrodes 25 and 26 and whose output is connected to the fault signal encoder 16. When one or more of the filaments of the lamps of the plurality of lamps 15 burn-out or open, a voltage differential is created between the inputs of the OCSENSE comparator 12 and the open circuit condition is signaled to the fault signal encoder 16. The output of the fault signal encoder 16 is connected to the gate a field effect transistor 17 whose source is connected to the supply voltage terminal 21 and drain is connected to a fault output terminal 18. When an error condition is detected from the TLIM 5, ILIM comparator 11, and/or OCSENSE comparator 12, the output of the fault signal encoder 16 goes low pulling the fault output terminal to the supply voltage terminal 21. The fault output terminal 18 could, for example, control a dashboard light warning of a problem. The fault output terminal 18 could be multiplexed onto a bus if a bus system is used in the wiring system.

By now it should be appreciated that there has been provided a system in an automobile for combining several signals into one driver signal for controlling the light intensity in a plurality of indicator lamps and for providing over-current and over-temperature protection.

I claim:

1. A lamp intensity control system for driving at least one lamp, comprising:
   at least one input terminal coupled for receiving at least one control signal;
   control signal encoder means coupled to said at least one input terminal for receiving said at least one control signal for providing a driver signal modulated as a function of the encoding of said at least one control signal;
   lamp driver means coupled for receiving said driver signal and coupled to the at least one lamp for providing a current responsive to said driver signal for controlling the intensity of the at least one lamp;
   temperature sensing means located adjacent to and coupled to said lamp driver means for disabling said lamp driver means upon detecting a predetermined temperature threshold thereof; and
   modulation means coupled to said control signal encoder means for modulating said driver signal.

2. The lamp intensity control system according to claim 1 wherein said at least one input terminal further comprises;
   a first input terminal coupled for receiving a tail light indicator signal;
   a second input terminal coupled for receiving a brake indicator signal; and
   a third input terminal coupled for receiving a turn indicator signal.

3. The lamp intensity control system according to claim 2 wherein said lamp driver means further comprises:
   a power transistor having a first current carrying electrode coupled for receiving a first supply voltage terminal, a second current carrying electrode coupled to the at least one lamp, and having a third current carrying electrode, a fourth current carrying electrode and control electrode; and gate driver means coupled for receiving said driver signal and coupled to the control electrode for turning said power transistor on and off.

4. A lamp intensity control system for driving at least one lamp, comprising:
- at least one input terminal coupled for receiving at least one control signal, said at least one input terminal including,
  - a first input terminal coupled for receiving a tail light indicator signal,
  - a second input terminal coupled for receiving a brake indicator signal, and
  - a third input terminal coupled for receiving a turn indicator signal;
- control signal encoder means coupled to said at least one input terminal for receiving said at least one control signal for providing a driver signal modulated as a function of the encoding of said at least one control signal;
- lamp driver means coupled for receiving said driver signal and coupled to the at least one lamp for providing a current responsive to said driver signal for controlling the intensity of the at least one lamp, said lamp driver means including,
  - a power transistor having a first current carrying electrode coupled for receiving a first supply voltage terminal, a second current carrying electrode coupled to the at least one lamp, and having a third current carrying electrode, a fourth current carrying electrode and control electrode, and
  - gate driver means coupled for receiving said driver signal and coupled to the control electrode for operating said power transistor;
- temperature sensing means located adjacent to and coupled to said lamp driver means for providing an over-temperature signal to disable said lamp driver means upon detecting a predetermined temperature threshold thereof;
- modulation means coupled to said control signal encoder means for modulating said driver signal;
- a fault output terminal;
- fault signal encoder means coupled for receiving said over-temperature signal and over-current and open lamp signals, and coupled to said fault output terminal for providing a fault signal;
- a first comparator having a first and second input coupled to said second and fourth current carrying electrodes, respectively, of said power transistor, and having an output coupled to said fault signal encoder means for providing said over-current signal; and
- a second comparator having first and second inputs coupled to said second and third current carrying electrodes, respectively, of said power transistor, and having an output coupled to said fault signal encoder means for providing said open-lamp signal.

5. The lamp intensity control system according to claim 4 wherein said power transistor is a SENSFET.

6. A monolithically integrated lamp intensity control system which combines a plurality of signals into a single pulse width modulated signal for controlling the intensity in at least one lamp, comprising:
- control signal encoder means coupled for receiving a tail light signal, a brake light signal, and a turn indicator signal for providing a decoded driver signal;
- driver means coupled for receiving the decoded driver signal for providing a gate driver signal;
- a SENSFET having a gate coupled for receiving the gate driver signal, a source coupled for receiving a first supply voltage, a first drain coupled to said at least one lamp, and having a second and third drain;
- pulse width modulation means coupled to said control signal encoder means for modulating the decoded driver signal; and
- temperature limit means located in proximity to said SENSFET and coupled to said driver means for turning off said driver means if the temperature detected by said temperature limit means exceeds a predetermined value, and for providing an over-temperature signal.

7. The lamp intensity control system according to claim 6 wherein said driver means further comprises a charge pump means for providing a charge pump voltage which has a magnitude greater than the magnitude of the first supply voltage for over-driving the gate of said SENSFET.

8. The lamp intensity control system according to claim 6 further comprising a fault signaling means coupled to the second and third drains for providing a fault signal if a short circuit or open-lamp condition occurs.

9. The lamp intensity control system according to claim 8 wherein said fault signaling means further comprises:
- a fault output terminal;
- fault signal encoder means coupled for receiving the over-temperature signal, an over-current and an open lamp signal, and coupled to said fault output terminal for providing a fault signal;
- a first comparator having a first and second input coupled to said first and third drains, respectively, of said SENSFET, and having an output coupled to said fault signal encoder means for providing said over-current signal; and
- a second comparator having first and second inputs coupled to said first and second drains, respectively, of said SENSFET, and having an output coupled to said fault signal encoder means for providing said open-lamp signal.

10. The lamp intensity control system according to claim 7 further comprising an oscillator coupled to said pulse width modulation means and to said charge pump.

11. A monolithically integrated lamp intensity control system for combining the tail light, brake light, and turn indicator light signals into a single indicator signal that is pulse width modulated to control the intensity of a plurality of lamps being controlled, said lamp intensity control system comprising:
- a first supply voltage terminal for receiving a first supply voltage;
- a second supply voltage terminal for receiving a second supply voltage;
- a first input terminal for receiving the tail light indicator signal;
- a second input terminal for receiving the brake light indicator signal;
- a third input terminal for receiving the turn indicator signal;
- a fault output terminal;
- control signal encoder means coupled to said first, second, and third input terminals for decoding the tail light, brake light and turn indicator light signals into the single indicator signal;

pulse width modulation means coupled to said control signal encoder means for pulse width modulating the single indicator signal;

gate driver means coupled to said first supply voltage terminal and coupled for receiving the single indicator signal for providing an amplified single indicator signal wherein the peak magnitude is greater than the peak magnitude of the first supply voltage;

a SENSFET having a gate coupled for receiving the amplified single indicator signal, a source coupled for receiving the first supply voltage, a first drain coupled to said plurality of lamps, a second drain coupled to said second supply voltage terminal and a third drain coupled to the plurality of lamps;

fault signal encoder means coupled to said fault output terminal for providing a fault output signal;

a first comparator having a first and second input coupled to the first and third drains, respectively, of said SENSFET, and having an output coupled to said gate driver means and to said fault signal encoder means for providing an over-current signal; and a second comparator having first and second inputs coupled to the first and second drains, respectively, of said SENSFET, and having an output coupled to said fault signal encoder means for providing an open-lamp signal; and temperature limit means located in proximity to said SENSFET and coupled to said fault signal encoder means and to said gate driver means for turning off said driver means if the temperature detected by said temperature limit means exceeds a predetermined value.

12. The lamp intensity control system according to claim 11 wherein said gate driver means further comprises a charge pump.

13. The lamp intensity control system according to claim 12 further comprising an oscillator coupled to said charge pump and to said pulse width modulator means.

* * * * *